US010018682B2

United States Patent
Kaupp et al.

(10) Patent No.: US 10,018,682 B2
(45) Date of Patent: Jul. 10, 2018

(54) BATTERY MANAGEMENT SYSTEM FOR A BATTERY HAVING A PLURALITY OF BATTERY CELLS, AND METHOD THEREFOR

(71) Applicant: Robert Bosch GmbH, Stuttgart (DE)

(72) Inventors: Patrick Kaupp, Stuttgart (DE); Thomas Schaedlich, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/118,941

(22) PCT Filed: Jan. 30, 2015

(86) PCT No.: PCT/EP2015/051893
§ 371 (c)(1),
(2) Date: Aug. 15, 2016

(87) PCT Pub. No.: WO2015/121082
PCT Pub. Date: Aug. 20, 2015

(65) Prior Publication Data
US 2016/0356857 A1    Dec. 8, 2016

(30) Foreign Application Priority Data
Feb. 13, 2014   (DE) .................. 10 2014 202 626

(51) Int. Cl.
*G01N 27/416* (2006.01)
*G01R 31/36* (2006.01)
(Continued)

(52) U.S. Cl.
CPC ............ *G01R 31/3658* (2013.01); *B60L 3/12* (2013.01); *B60L 11/1853* (2013.01);
(Continued)

(58) Field of Classification Search
CPC .......... G01R 31/3658; G01R 19/16542; G01R 31/3648; H02J 7/0021; Y02E 60/12
(Continued)

(56) References Cited

U.S. PATENT DOCUMENTS

2005/0242775 A1* 11/2005 Miyazaki .............. H02J 7/0026
320/116
2006/0170389 A1    8/2006 Adra
(Continued)

FOREIGN PATENT DOCUMENTS

DE    102011085787    5/2013
JP    2004134372    4/2004
(Continued)

OTHER PUBLICATIONS

International Search Report for Application No. PCT/EP2015/051893 dated Apr. 29, 2015 (English Translation, 2 pages).

*Primary Examiner* — Arun Williams
(74) *Attorney, Agent, or Firm* — Michael Best & Friedrich LLP

(57) ABSTRACT

The invention relates to a battery management system for a battery having a plurality of battery cells connected in series, comprising a battery control unit, a plurality of low-voltage measuring devices, by means of which the voltage of one or more battery cells can be measured, and comprising one or more high-voltage measuring devices for a voltage across a plurality or all the battery cells, and/or at least one current measuring device, by means of which a current from or through the battery can be measured, and/or at least one a measuring module comprising a high-voltage measuring device, and a current measuring device, characterized by a signal transmission device, by way of which signals from low-voltage measuring devices and from at least one of the high-voltage measuring devices and/or the current measur- (Continued)

ing device and/or the measuring module can be transmitted to the battery control unit.

13 Claims, 4 Drawing Sheets

(51) Int. Cl.
    *H04Q 9/00*     (2006.01)
    *B60L 3/12*     (2006.01)
    *B60L 11/18*     (2006.01)
    *H02J 7/00*     (2006.01)
    *H01M 10/42*     (2006.01)

(52) U.S. Cl.
    CPC ...... *B60L 11/1861* (2013.01); *G01R 31/3624* (2013.01); *H02J 7/0021* (2013.01); *H04Q 9/00* (2013.01); *B60L 2240/547* (2013.01); *B60L 2240/549* (2013.01); *H01M 2010/4271* (2013.01); *H01M 2010/4278* (2013.01); *H02J 2007/0096* (2013.01); *H04Q 2209/30* (2013.01); *Y02T 10/705* (2013.01); *Y02T 10/7011* (2013.01)

(58) Field of Classification Search
    USPC ........................................................ 324/434
    See application file for complete search history.

(56) References Cited

U.S. PATENT DOCUMENTS

| 2011/0050237 A1 | 3/2011 | Sekizaki et al. |
| 2012/0217936 A1* | 8/2012 | Kung ............... H02J 7/0077 320/163 |
| 2013/0088237 A1 | 4/2013 | Kamata et al. |
| 2013/0175976 A1 | 7/2013 | Rana |
| 2014/0377602 A1 | 12/2014 | Thoelmann |
| 2016/0241056 A1 | 8/2016 | Kudo et al. |

FOREIGN PATENT DOCUMENTS

| JP | 2013027298 | | 2/2013 |
| JP | 2013510556 | A | 3/2013 |
| JP | 2014506112 | | 3/2014 |
| JP | 2014511095 | | 5/2014 |
| JP | 2014523606 | | 9/2014 |
| KR | 20090006292 | A | 1/2009 |
| WO | 2012/099821 | | 7/2012 |
| WO | 2012/110497 | | 8/2012 |
| WO | 2013007617 | | 1/2013 |
| WO | 2013008408 | A1 | 1/2013 |

* cited by examiner

BATTERY MANAGEMENT SYSTEM FOR A BATTERY HAVING A PLURALITY OF BATTERY CELLS, AND METHOD THEREFOR

BACKGROUND OF THE INVENTION

The present invention relates to a battery management system for a battery having a plurality of battery cells connected in series, the battery management system comprising a battery control unit, a plurality of low-voltage measuring devices, by means of which the voltage of one or more battery cells can be measured in each case, and comprising at least one of the following components: one or more high-voltage measuring devices for a voltage across a plurality or all the battery cells, at least one current measuring device, by means of which a current from or through the battery can be measured, and at least one measuring module comprising a high-voltage measuring device and a current measuring device. The invention further relates to a battery and a method for measuring a plurality of low voltages of either individual battery cells or groups of a plurality of battery cells by means of a plurality of low-voltage measuring devices and for measuring a high voltage of a plurality or all of the battery cells with a high-voltage measuring device. High voltages cannot be measured using low-voltage measuring devices without additional measures. Voltages are designated here as high voltage which exceed the voltage of one or several battery cells connected in series. According to a conventional, general definition, these are DC voltages over 60 V and AC voltages over 25 V. The term is used in the field of electric vehicles. Lesser voltages are denoted as low voltages in this patent application.

In the prior art, additional system voltages, typically high voltages, such as, for example:
- the high voltage of a plurality or all of the battery cells,
- intermediate circuit voltages,
- vehicle electrical system voltages of charging apparatuses,
- system voltages of low-voltage-high voltage-DC-DC converters, are measured and monitored by a microprocessor system in a battery management system for electric and hybrid vehicles, in particular for the use with lithium ion cells, in addition to low voltages, such as individual cell voltages. Voltages from a high-voltage section of the battery or respectively systems connected thereto can be measured via a high-voltage section of the battery control unit, and corresponding measurement data can be transmitted in an electrically isolated or respectively galvanically separated manner via a digital bus on a low-voltage section of the battery control unit. Individual cell voltages of individual battery cells or other measurement variables, such as temperatures of the individual cells or the control electronics thereof, are measured by cell size measuring devices and corresponding measurement data is transmitted to the battery control unit. In the prior art, this transmission typically occurs via an isolated or respectively galvanically separated low-voltage interface.

The battery control unit typically monitors the cell voltage of each individual cell, the total voltage of the battery and the current which flows through the series circuit of the battery cells. The total system consisting of battery control unit and monitoring devices is referred to as the battery management system. Specially integrated circuits (ICs) are used for the cell voltage measurements, said ICs measuring the voltage of an associated cell. Such an IC can be provided for each cell; however, the cell voltages of a plurality of cells are typically measured with one IC, for example between 6 and 16 cells per IC. As a result, costs for the ICs can be saved. The measured voltage values are digitized and are transmitted to the receiver of the data by means of a special bus system, in which the voltage measuring devices are connected to one another in a chain and form a portion of the bus system. Such a bus system is generally referred to as a "daisy chain". The bus runs not only in the interior of one or a plurality of ICs.

In order to measure the current through the series circuit of the battery cells, only one current converter is required in many cases because, in any case, this current flows in equal amounts through all of the cells unless the cells in a plurality of strings are connected in parallel to one another. A plurality of current sensors can then be provided. According to the prior art, the current sensors are connected to the receiver of the current values by means of another interface or respectively another bus.

In a battery monitoring system, in which the cell voltage values and current values are processed by the same receiver, for example a battery control unit, two different interfaces are then provided for the battery control unit. Either an additional voltage sensor and thus a third interface to the receiver of the data thereof, for example the battery control unit, is required to measure the high voltage; or the high voltage is measured directly by the receiver, for example the control device. This constellation in the prior art makes the synchronization of the scanning of individual voltage values, the high voltage value and current values (if required), which scanning takes place as simultaneously as possible, more difficult. The WIPO patent application WO2013/007617 discloses, for example, two separate buses for two different strings of voltage measuring devices.

The architecture of a battery management system according to the prior art is depicted in FIG. 1 in a simplified manner. A battery string consisting of battery cells connected to one another in series, for example up to 120 cells, is monitored by modular cell measuring modules, which each comprise a low-voltage measuring device. The measuring modules measure the voltage of each individual cell and detect the temperature of a battery cell and/or the associated electronics thereof. The measurement values are transmitted to the battery control unit via a common bus. According to the prior art, the topology of the bus interface is configured according to the daisy chain principle. A cell measuring module, which is situated at the end of the chain of cell measuring modules, is directly, i.e. not via other cell measuring modules, connected to the battery control unit. The further cell measuring modules are each connected to the chain by means of the precursors thereof (series circuit principle). Due to the voltage offset between the individual battery cells within the series circuit thereof, a special switching circuit, which carries out the necessary level conversion, is integrated into each of the cell measuring modules.

In order to measure the system voltages, a circuit section comprising an interface for high-voltage signals is provided in the battery control unit. The signals having high-voltage potential are transformed into further processed low-voltage signals, filtered and subsequently converted into a digital signal. The digital signal is (e.g. capacitively, inductively or optically) electrically isolated by means of a separating device and transmitted to the low-voltage section of the battery control unit and processed there.

In total, a plurality of interfaces to the battery control unit results, said interfaces being required to detect all of the necessary system variables. A considerable amount of effort and cost additionally arises when detecting all of the system variables in a temporally synchronous manner for the purpose of being further algorithmically processed.

According to the prior art, the use of an analog-to-digital converter of a microcontroller is also known, said converter constituting the battery control unit or a section thereof, in order to measure voltages or currents of battery cells or of the whole battery. The American patent application US 2006/0170389 discloses, for example, the use of an A/D converter comprising a multiplexer for measuring a plurality of voltages of battery cells. The American patent application US 2013/0175976 discloses the electrical isolation or galvanic separation of a CAN bus from a battery control system.

It was required to date to send a plurality of signals via a plurality of different bus systems to the corresponding measuring devices for each measurement with which the state of all the battery cells of the battery can be determined. To this end, a plurality of different commands having different protocols is required, which means increased effort and cost for the implementation of the process as well as increased computational effort for the execution of said process. This also applies equally to the commands for transmitting measurement signals from the measuring devices to the battery control unit.

SUMMARY OF THE INVENTION

The subject matter of the invention is a battery management system that comprises a signal transmission device, by way of which signals, such as measurement signals and control signals, not only from low-voltage measuring devices but also from the high-voltage measuring device and/or a current measuring device for measuring current that flows through the battery and/or a measuring module comprising a high-voltage measuring device and a low-voltage measuring device can be transmitted to the battery control unit.

Only a single interface at the battery control unit is thus required for this measurement periphery. It is accordingly possible to activate in all connected measuring systems the measuring process in all measuring devices by means of only one common trigger signal. Only a software protocol is required, with which trigger signals can be sent or measurement data can be queried from measuring devices and with which the measurement data can be transmitted. Measurement data can also be queried from a single connected measurement system. A synchronization of the commands of the battery control unit, e.g. via synchronization commands as according to the prior art, is no longer required. The components mentioned above have, provided that they are present in the battery management system, functionally compatible interfaces to the signal transmission device.

In one preferred embodiment of the battery management system, the signal transmission device is designed as a series circuit consisting of a plurality of measuring devices, which can be referred to as a daisy chain bus. In so doing, data from and to the battery control unit pass through at least one of the measuring devices and are conveyed to an adjacent measuring device. In particular, the low-voltage measuring devices and the high-voltage measuring device(s) are connected to the same bus. All measuring devices are preferably connected via a single bus to one another and to the battery control unit. Because only one bus is required, the wiring requirement of the measuring devices is reduced in total. In addition, an improved scalability results without additional cost and effort arising at the interfaces. Other measuring devices can, for example, be easily connected to the bus; or respectively said bus is expanded by further members of the series circuit. The galvanic separation of the battery control unit is advantageously further simplified because a multiple galvanic separation of the battery control unit from the signals of different buses is no longer required. In a particularly preferred manner, the battery control unit is however designed to be galvanically separated or respectively isolated from the inventive signal transmission device. In addition, the divisibility into groups of measuring devices is thus facilitated. The detection of high-voltage system voltages can, e.g., be easily outsourced to different subcomponents of the battery management system, for example the battery control unit, a contactor box, a fuse box or something similar.

In another embodiment of the battery management system, a high-voltage measuring device, which is particularly disposed in a measuring module, is equipped with a high voltage to low voltage converter. With the high voltage to low voltage converter, measurement signals, which are connected to a high-voltage potential or are based on the same, can be converted into low-voltage signals which are compatible with the voltages of a low-voltage measuring device, the signal transmission device and/or the battery control unit. By means of such a high voltage to low voltage converter, the high-voltage measurement can easily be transferred to different components which can particularly carry out a low-voltage measurement and can particularly communicate in each case with the signal transmission device. By means of a measuring module according to this embodiment, the possibility arises for expanding the battery management system to other high-voltage measuring devices or respectively to total voltage measuring devices in the measuring module without further devices for the galvanic separation being needed. Such other high-voltage measuring devices can, for example, measure other system voltages within the battery management system. A further advantage is that the battery control unit requires exclusively low-voltage components which allows for a significantly more compact embodiment of the battery control unit. The high voltage to low voltage converter is preferably configured as a resistive voltage divider, preferably comprising high-impedance resistors which also do not allow a high current to flow under a high voltage; thus enabling the energy consumption to remain low.

In a further embodiment of the battery management system, said battery management system comprises a high-voltage measuring device, which is equipped to measure the high voltage before a cut-off relay for disconnecting the battery from the current loads thereof, and a further high-voltage measuring device with which a high voltage can be measured after this cut-off relay. Such a configuration of the battery management system is used, for example, to check whether such a cut-off relay is working in a trouble-free manner. This can, for example, be achieved by comparing actuation signals of the cut-off relay with measuring results of the two high-voltage measuring devices.

In a further embodiment of the battery management system, said battery management system comprises at least one voltage measuring chip, which comprises a communication module which is equipped to conduct communication via the signal transmission device. In a particularly preferred manner, the communication module is galvanically separated and/or electrically isolated from other components of the voltage measuring chip. As a result, it is possible for the voltage measuring chip to be used in various battery cells which can lie at other potentials in comparison to the potential of the signal transmission device. It is also conceivable to use this voltage measuring chip for high-voltage measurements, wherein a high voltage to low voltage converter can be provided for voltage reduction. Such a voltage measuring chip can particularly form the nucleus of a high-voltage measuring device. A voltage measuring input of the voltage measuring chip that is suitable for high voltage is likewise conceivable. Alternatively, it is further conceivable to carry out the galvanic separation between the signal transmission device and the voltage measuring chip in a separate module, which is functionally independent of and/or spatially separated from the voltage measuring chip or respectively even from the voltage measuring device that comprises the voltage measuring chip. Instead of an integrated embodiment of the galvanic separation on the voltage measuring chip, it is conceivable in another alternative to implement the galvanic separation in another integrated circuit or to build a discrete circuit therefor. In a preferable manner, the unit that performs the galvanic separation or respectively electrical isolation comprises a communication interface which is suitable for communicating with the signal transmission device. This applies to all variants or alternatives described in this section. The voltage measuring chip can, conceivably in various embodiments, be disposed at any desired point of the signal transmission device, including the position logically closest to the battery control unit.

In a further embodiment of the battery management system, a high-voltage measuring device has the same voltage measuring chip with which at least one individual low-voltage measuring device is equipped. This prevents a special voltage measuring chip having to be developed for the high-voltage measuring device, which is manufactured in significantly smaller quantities than the low-voltage measuring devices. The adaptation of the different voltage levels can be achieved by a high voltage to low voltage converter. A voltage measuring chip refers to an integrated circuit which comprises a measuring function for a voltage. In addition, the voltage measuring chip comprises the interface to the signal transmission device; thus enabling the high-voltage measuring device to communicate with the battery control unit and the low-voltage measuring devices. This also applies if the high-voltage measuring device is part of a measuring module.

In a further embodiment, a battery management system is proposed which comprises a measuring module that has a high-voltage measuring device and a current measuring device, by means of which current can be measured that flows through the battery. The measuring module is equipped to transmit measurement signals by means of an interface via the signal transmission device, wherein the high-voltage measuring device, at least parts of the current measuring device and the interface are integrated on a chip. The measuring module is equipped to transmit measurement signals from the current measuring device and from the high-voltage measuring device via the signal transmission device. In a preferred manner, the measuring module has only one communication interface to the signal transmission device. The interface to the signal transmission device is most preferably the same interface which the low-voltage measuring devices also have; thus enabling a communication with said low-voltage measuring devices as well as with the battery control unit to be possible. In an existing battery management system, such a measuring module can replace a conventional current measuring module, which does not have a high-voltage measuring device. Hence, current through the battery as well as a high voltage can be measured with the same module, which reduces the wiring requirement for the communication. The measuring module or at least parts thereof can be designed as a single integrated circuit or respectively as a chip. It is also conceivable to implement the measuring module with more than one chip. Such integrated solutions reduce the wiring requirement and require only a little space, which is cost effective. In addition, a high degree of reliability results. In order to be able to measure the current flowing through the battery, a line conducting battery current runs through the measuring module.

In a further embodiment of the battery management system, the measuring module has at least two current measuring devices, by means of which current can be measured that flows through the battery. In this way, an increased safety of the battery can be achieved with the battery management system because, by means of the redundancy of at least two current measuring devices, it can be recognized on the basis of various values whether these are operating properly.

In a further embodiment of the battery management system, a measuring module comprises a temperature measuring device according to one of the previously described embodiments.

In a further embodiment of the battery management system, the measuring module comprises one or a plurality of voltage measuring devices for all the system voltages which are measured within the battery management system. Such system voltages can, for example, be measured via multi-purpose analog inputs of integrated circuits, such as, e.g., microcontrollers or DSPs or special ASICs or the like. In a preferred manner, a high voltage to low voltage converter, e.g. a voltage divider, is disposed upstream of such an input. The high voltage to low voltage converter allows high voltage to be divided down to a voltage which is suitable for being detected with the input. Such a voltage divider is preferably designed to be of high ohmic resistance so that the high voltage does not drive any large voltages through the voltage divider. A plurality of high voltage to low voltage converters can be provided, which each can be connected to a voltage measuring device by means of a respective connecting switch. Only one voltage to be measured is in each case connected to a voltage measuring device. A single voltage measuring device can be provided for all of the voltages to be measured. The voltage measuring devices can, e.g., be part of a microcontroller or a DSP or an ASIC. The switching of the voltage divider can take place via multi-purpose outputs of a microcontroller or DSP or respectively ASCIC.

In a further embodiment of the battery management system, the measuring module comprises a communication component, which is not suited for direct communication with the battery control unit because this communication component operates, e.g., with a potential that does not match with the potential of the battery control unit or with the signal transmission device. Such a communication component requires, for example, an electric isolation or galvanic separation from the battery control unit or the signal transmission unit. Because the galvanic separation in the measuring module is present in any case, the transfer of such a communication component to the measuring module is advantageous because the galvanic separation or isolation is not again required separately.

In a further embodiment of the battery management system, the measuring module comprises a voltage supply device, which is or can be electrically connected to the poles of the battery. The measuring module can thus be supplied with high voltage from the battery. Such a connection to the power supply can additionally be used to detect the high voltage of the battery.

In a further embodiment of the battery management system, the measuring module comprises a differential measurement input for a voltage drop across a measuring resistor, with which a current of the battery can be measured. This measuring resistor is preferably designed to be of very low ohmic resistance and has in a very preferred manner a resistance of less than 100 μΩ. For example, the accuracy of the voltage measurement is on the order of ±1%.

In a further aspect of the invention, a battery is proposed which has a battery management system according to one of the embodiments described above.

In yet another aspect of the invention, a method is proposed with which a plurality of low voltages, in particular individual voltages, from a plurality of battery cells can each be measured individually. To this end, a plurality of low-voltage measuring devices are used. According to the method, a high voltage of the battery, which can be a voltage across a plurality of all of the battery cells, can be measured by means of a high-voltage measuring device. The signals from the low-voltage measuring devices and signals from the high-voltage measuring device are transmitted via the same signal transmission device to the battery control unit. Embodiments of this method can be carried out by means of embodiments of the battery management system described above, wherein features of these embodiments relating to the procedural approach may correspond to the features of embodiments of this method.

BRIEF DESCRIPTION OF THE DRAWINGS

Preferred exemplary embodiments of the invention are described below with reference to the accompanying drawings. In the drawings.

DETAILED DESCRIPTION

Figure 1:
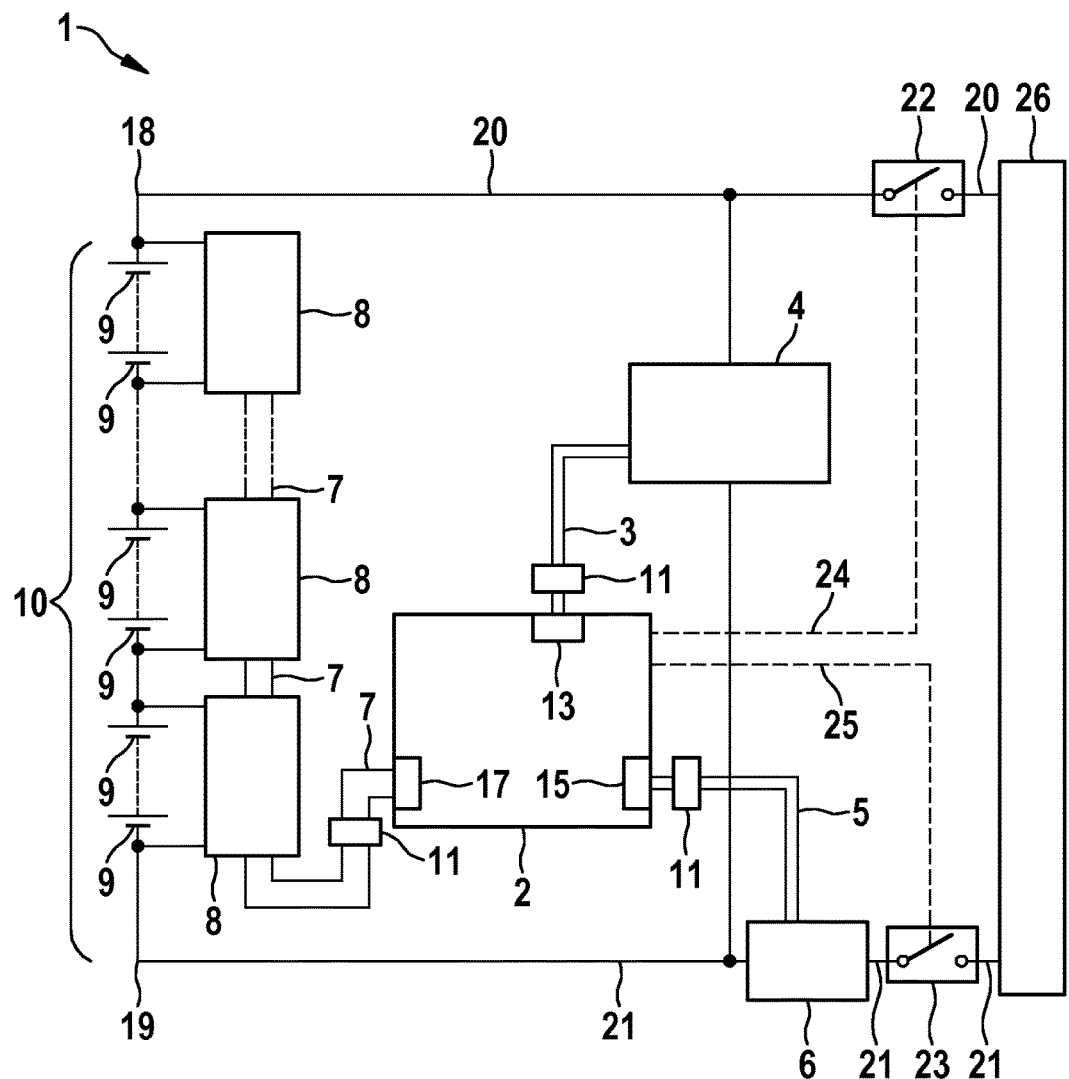
FIG. 1 shows a schematic circuit diagram of a battery management system according to the prior art.

FIG. 1 shows schematically the configuration of a battery management system 1 according to the prior art. The battery management system 1 comprises a battery control unit 2, which is connected to a first signal transmission device 3 comprising a high-voltage measuring device 4, to a current measuring device 6 via another signal transmission connection 5 and to a plurality of voltage measuring devices 8 via a third signal transmission device 7, said voltage measuring devices monitoring in each case one or, as depicted in FIG. 1, in each case a plurality of individual cells 9 of the battery 10. The signal transmission device 7 relates to a bus system comprising members linked in a series circuit (daisy chain), in which a plurality of low-voltage measuring devices 8 can communicate with the battery control unit 2 via the same bus by data passing through a low-voltage measuring device and being transmitted on to an adjacent low-voltage measuring device. In order to protect the battery control unit 2 from high voltages from low-voltage measuring devices 8, which measure voltage having a high potential in the series circuit of the individual battery cells, the signal transmission device 7 has a separating device 11, by means of which the potential of the battery control unit 2 can be separated from the potentials of the low-voltage measuring devices 8. The signal transmission devices 3 and 5 also each have such a separating device 11. The battery control unit 2 comprises three interfaces 13, 15, 17, which typically serve different buses having different protocols. The high-voltage measuring device 4 is connected to the poles 18 and 19 in the battery 10 in order to measure the voltage thereof. The current measuring device 6 is disposed in a current path 21 from the battery pole 19 to an intermediate circuit 26; thus enabling said current measuring device to measure the current flowing across the current path 21. A relay 22 or respectively 23 is disposed in each case in the current paths 20 and 21 from the poles 18 or respectively 19 to the intermediate circuit 26. The current flow across the current paths 20 or respectively 21 can be interrupted with the relay 22 or 23. The relays 22 or respectively 23 can be switched via control lines 24 or respectively 25 in order to separate the battery 10 from the intermediate circuit 26. Loads which are supplied by the battery 10 are typically connected to the intermediate circuit 26.

Figure 2:
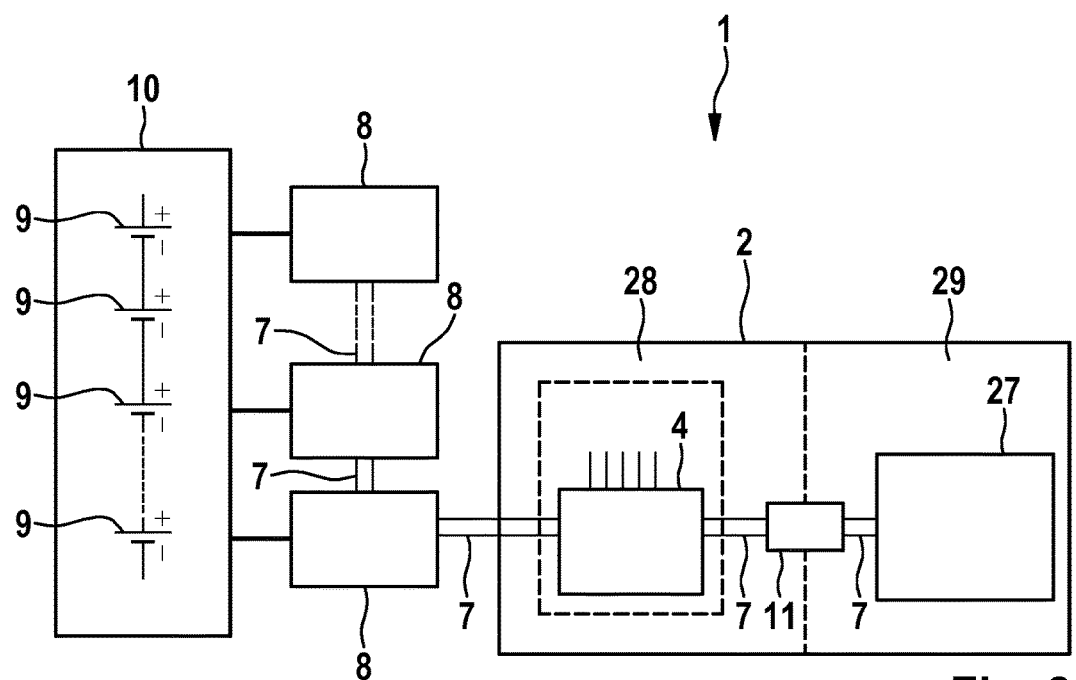
FIG. 2 shows a schematic circuit diagram of a first embodiment of the battery management system according to the invention.

FIG. 2 shows schematically the configuration of a battery management system according to the invention in a first embodiment. This embodiment is similar in some respects to the battery management system 1 according to the prior art, which was described in relation to FIG. 1. Identical components and features are denoted with the same reference numerals and are only described separately with regard to differences. It is important to mention the embodiments with regard to FIG. 1. The main difference to the prior art is the elimination of the bus systems 3 and 5. In order that the high-voltage measuring device 4 can communicate with devices which further process the data thereof, the high-voltage measuring device 4 is integrated into the bus 7 to the low-voltage measuring devices 8. The high-voltage measuring device is integrated into the battery control unit 2 in this embodiment so that said control unit has a high-voltage section 28 and a low-voltage section 29. The connection lines of the high-voltage measuring device 4 to voltages to be measured are only depicted schematically and without connection to the battery 10. The high-voltage measuring device can preferably measure a plurality of high voltages, which can deviate from the voltage across all the battery cells 9. These can, for example, be voltages across parts of the battery 10 or voltages in the periphery of said battery. A separating device 11 for galvanically separating the high-voltage section 28 from the low-voltage section 29 is disposed between said high-voltage section 28 and said low-voltage section 29 of the battery control unit 2, said separating device effecting a galvanic separation point in the signal transmission device 7. As a result, a microprocessor 27 which processes data from the signal transmission device 7 is galvanically separated from the voltage measuring devices 8 and the high-voltage measuring device 4. A current measuring device just as other conceivable components can likewise be comprised by the depicted battery management system 1. In contrast to the embodiment in FIG. 1, the low-voltage devices 8 can also measure a temperature of one or a plurality of battery cells 9 in addition to the voltage of one or a plurality of battery cells 9.

Figure 3:
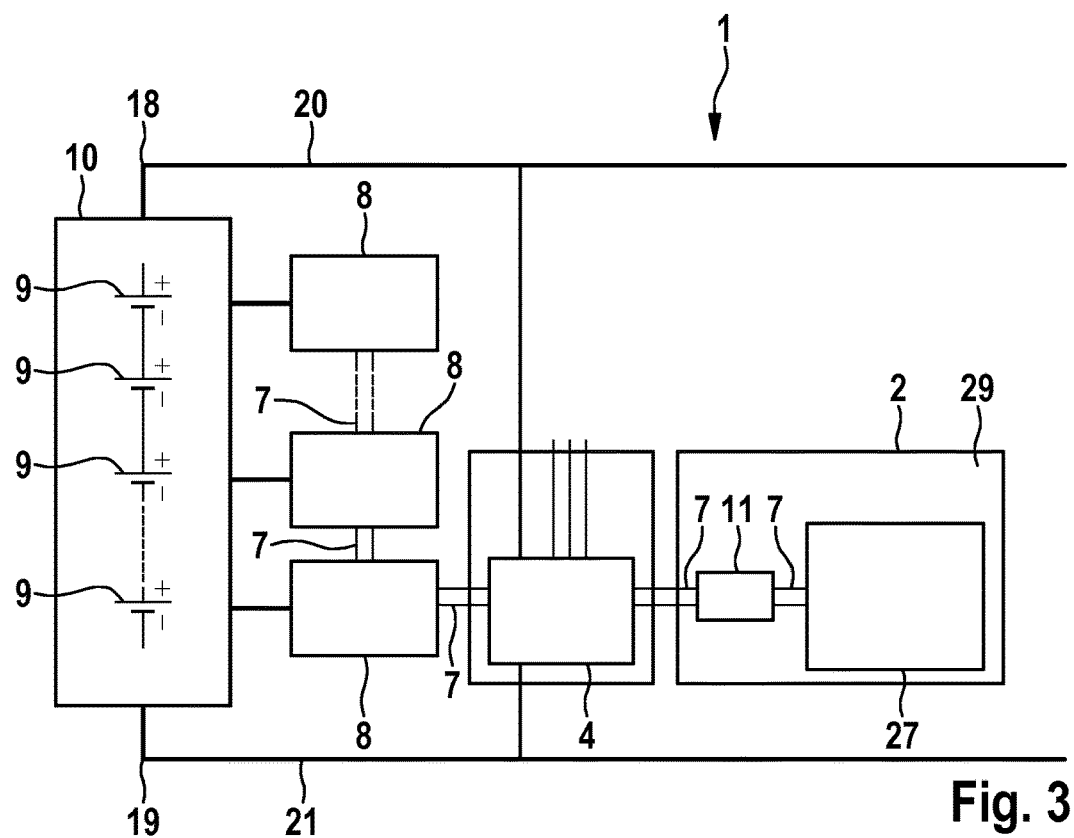
FIG. 3 shows a schematic circuit diagram of a second embodiment of the battery management system according to the invention.

FIG. 3 shows schematically a second embodiment of the battery management system 1 according to the invention, which coincides to a large extent to the embodiment depicted in FIG. 2. The following discussion will only deal with differences to this embodiment. Identical features and components are denoted with the same reference numerals. In contrast to the embodiment depicted in FIG. 2, the high-voltage measuring device 4 is separated from the battery control unit 2 and configured as a separate unit. This facilitates a greater degree of flexibility in distributing the components, e.g. in an electric vehicle, where cable length can be spared in the wiring layout. In FIG. 3, the poles of the battery 18 and 19 and the connection paths 20 and 21 connected thereto are depicted. The high-voltage measuring device 4 is connected to these connection paths 20 and 21; thus enabling said device to measure the voltage between the potentials thereof.

Figure 4:
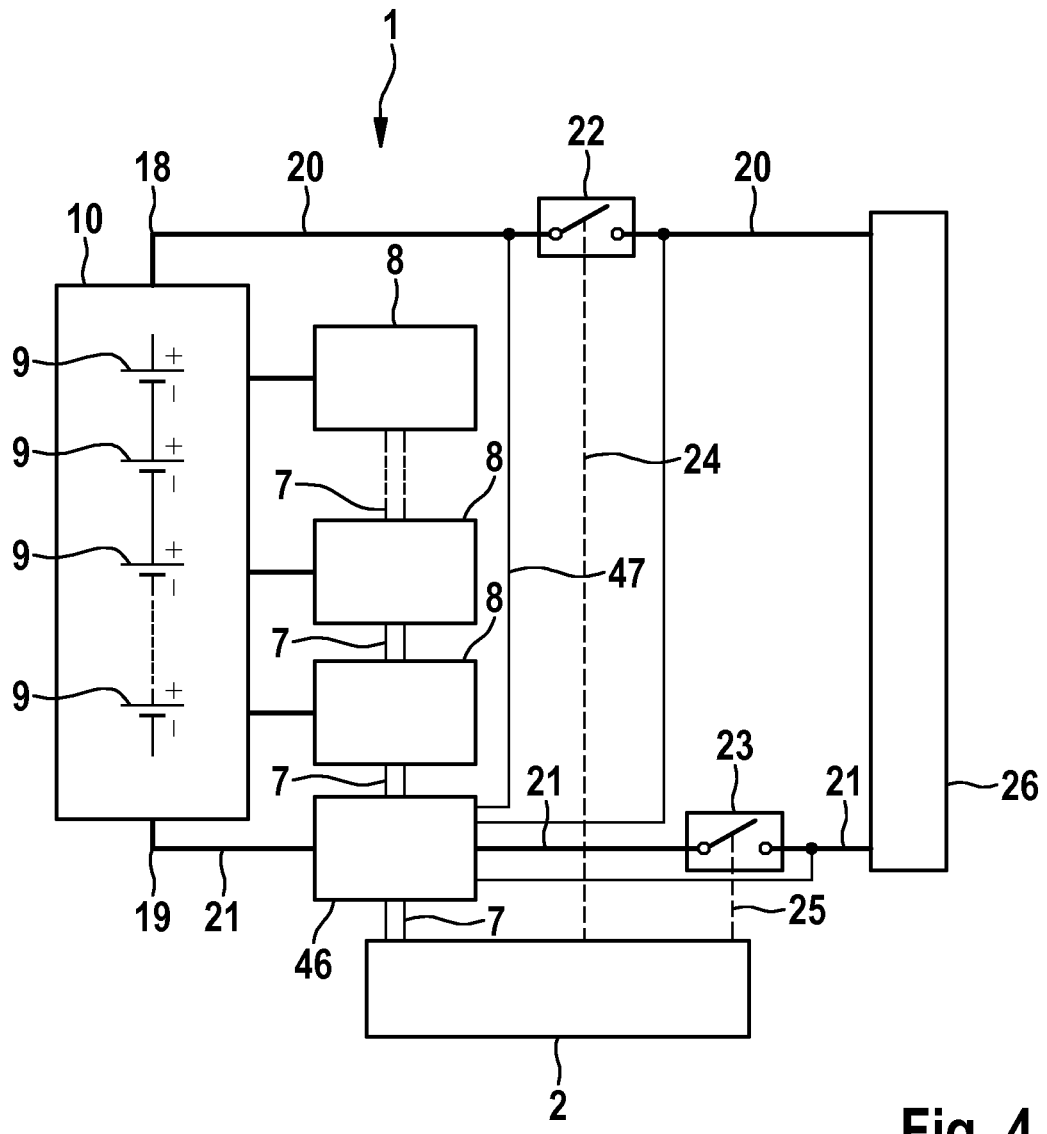
FIG. 4 shows a schematic circuit diagram of a third embodiment of the battery management system according to the invention.

FIG. 4 shows schematically a third embodiment of the battery management system 1 which coincides in substantial parts to the embodiments shown in FIGS. 2 and 3. Only differences to these embodiments are discussed. Identical features and components have the same reference numerals. In contrast to the previously described embodiments, the embodiment of FIG. 4 comprises a measuring module 46 which can measure a high voltage as well as a current of the battery 10. This measuring module 46 is preferably disposed in a position in the battery management system 1 which is occupied by a current measuring device 6 in accordance with the prior art. In contrast to the prior art, the measuring module is however incorporated into the signal transmission device 7, which transmits signals from the voltage measuring devices 8 to the battery control unit 2. In so doing, the measuring module is preferably the link in the chain of linked participants in the signal transmission by means of the signal transmission device 7, which link is disposed closest to the battery control unit 2. Current from the pole 19 flows through the measuring module 46, said current being conducted via the current connection path 21 through the measuring module 46; thus enabling said current to be available to the current measuring device for measuring. Alternatively, the module 46 can, of course, also be disposed in the current conduction path 20. In order for the high-voltage measuring device, which forms a part of the measuring module 46, to be able to measure the voltage between the poles 18 and 19 of the battery, the measuring module 46 is connected via a voltage measuring connection 47 to the battery pole 18 or respectively 19, the current of which does not flow through the measuring module 46. As in the prior art, relays 22 and 23 can be actuated via control lines 24 or 25 from the battery control unit 2 in order to separate an intermediate circuit 26 from the battery 10.

Figure 5:
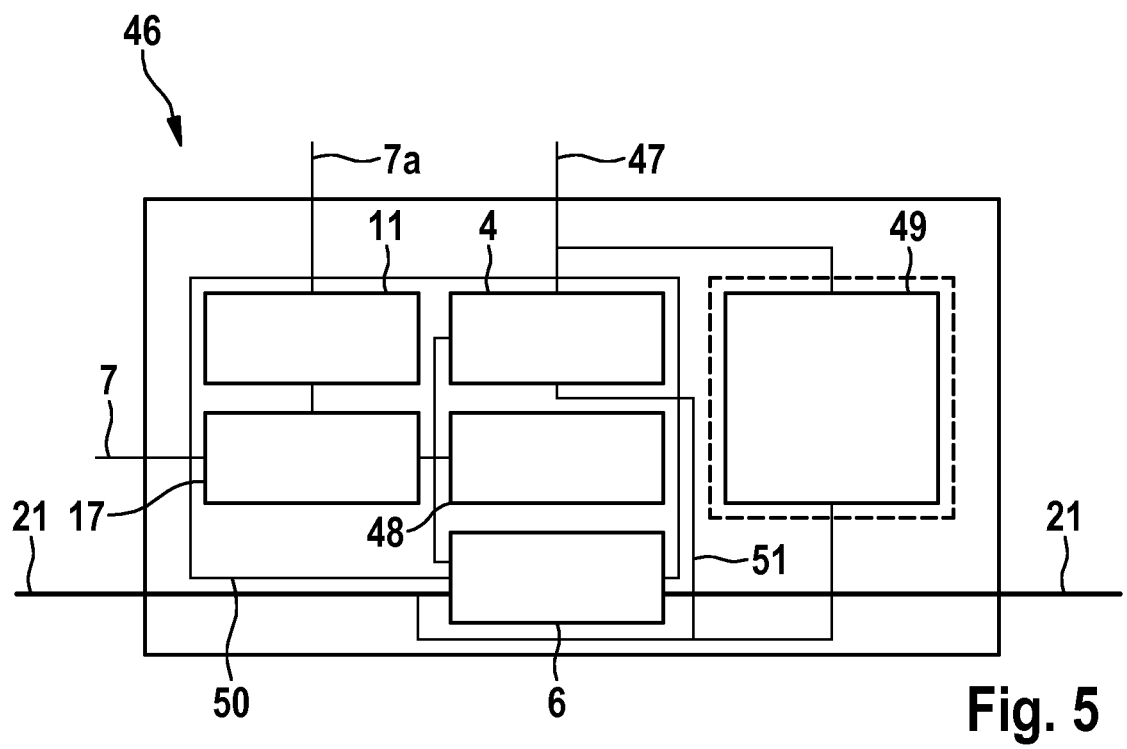
FIG. 5 shows a schematic circuit diagram of a measuring module for a high voltage and a current of the battery, which can form a part of a battery management system according to the invention.

FIG. 5 shows schematically the configuration of a measuring module 46. The measuring module 46 is, as is also depicted in FIG. 4, disposed in the current conduction path 21; thus enabling current from the battery to flow through the current measuring device 6 via the current conduction path 21. The current measuring device 6 consists preferably of two separate current sensors, which operate redundantly. In this way, it can be determined whether one of the current sensors operates in a faulty manner. It is conceivable to use even more current sensors in order to increase the redundancy. The current sensors conduct the measurement data thereof to an interface 17, which can send said data to other components of the battery management system 1 via the signal transmission device 7. The signal transmission device 7 relates to a linked bus system, which is also referred to as a daisy chain. The interface 17 can send signals via an optional galvanic separation 11 and via a signal transmission path 7a that connects the interface 17, for example, to a central control unit, e.g. of a vehicle. The connection 7a preferably forms a part of the signal transmission device 7, whereby a connected central control unit is likewise part of the linked bus system of the signal transmission device 7. The measuring module 46 furthermore comprises one or a plurality of temperature sensors 48 which can measure the temperature of the measuring module 46 or of components thereof. Corresponding measurement data can be transmitted to the interface 17, which can send said data forward via the signal transmission device 7. The measuring module 46 furthermore comprises one or a plurality of high-voltage measuring devices 4. This is or respectively these are connected by means of measuring lines 47 or respectively 51 to the potentials of the poles 18 and 19 of the battery 10. The voltage measuring line 51 runs within the measuring module 46 because the potential of the pole 19 is internally available on the current transmission path 21. Alternatively, the current transmission path 20 can also run through the measuring module 46 so that the voltage measuring line is connected to the pole 18, wherein the measuring line 47 is correspondingly connected to the pole 19. The one or the plurality of high-voltage measuring devices 4 conducts the data thereof to the interface 17, from which they can be transmitted further via the signal transmission device 7 or respectively 7a. The measuring module 46 furthermore comprises a voltage supply device 49, which uses a voltage to supply the measuring module 46, which voltage is applied between the voltage measuring line 47 and the current transmission path 21 or respectively 20. Because said voltage is the voltage of the battery 10, which is typically a high voltage due to the series circuit of the battery cells 9, the voltage supply device 49 has corresponding voltage reduction means. The components: interface 17, galvanic separating device 11, high-voltage measuring device 4, temperature measuring devices 48 and at least sections of the current measuring device 6 are configured as an integrated circuit 50, which is denoted below as measuring module IC 50.

Figure 6:
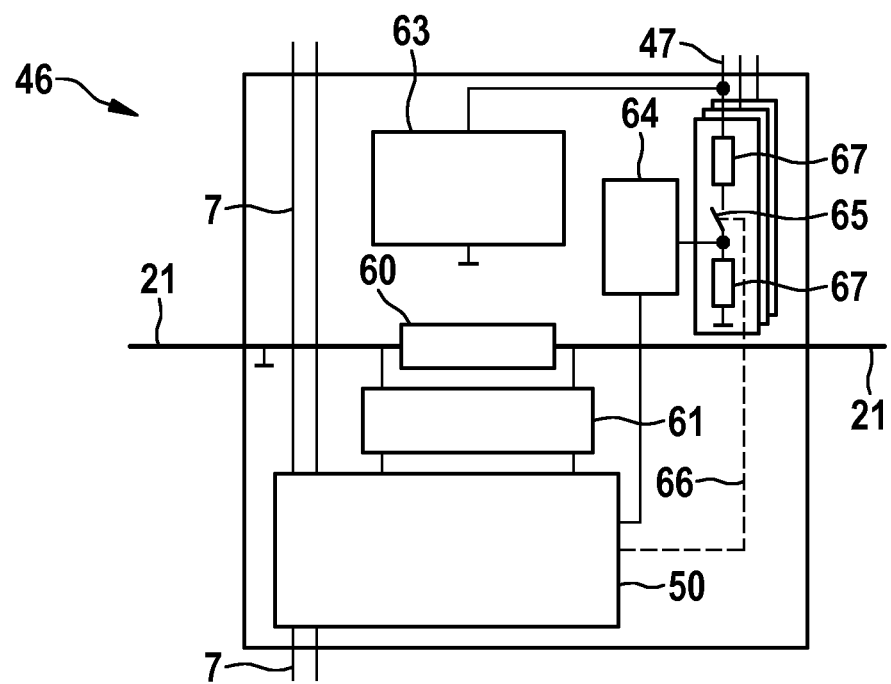
FIG. 6 shows a schematic circuit diagram of a current measuring device, which can form a part of a measuring module or a part of the battery management system which is independent from the measuring module.

FIG. 6 shows schematically the internal configuration of a measuring module 46. The measuring module 46 comprises a measuring resistor 60, which is disposed in the current conduction line 21. Alternatively, the measuring resistor 60 can also be disposed in the current conduction path 20. When current is flowing through the measuring resistor 60, a voltage arises across the same which is typically proportional to the current flow. This voltage can be supplied to the measuring module IC 50 via an optional filter 61. The filter 61 can remove interfering frequencies from the signal. A plurality of measuring resistors 60 and also optionally a plurality of measuring module ICs 50 can be disposed within the measuring module 46.

In a general embodiment of the measuring module 46 which is not depicted, said measuring module can use another measuring principle instead of a measurement by means of a measuring resistor. For example, a measurement of a magnetic field which is related to the current flow can be performed in order to determine the strength of the current flow.

The measuring module IC 50 comprises an interface, via which said module can communicate with the signal transmission device 7. In this way, the current measuring device 6 can be inserted into the linked bus system of the signal transmission device 7. The measuring module furthermore preferably comprises an internal current supply 63. The measuring module IC 50 can measure a high voltage 10 in addition to measuring the voltage across the measuring resistor 60. To this end, the measuring module 46 is connected to the battery pole 18 via the voltage measuring line 47. In the alternative variant, in which the measuring resistor 60 is disposed in the current conduction path 20, the current measuring line 47 connects the measuring module 46 to the pole 19 of the battery 10. The voltage of the pole 18 or respectively 19 can be supplied to the measuring module IC 50 via a filter 64. The supply of this voltage can be interrupted by means of a switching device 65, wherein said switching device 65 can be switched by means of the measuring module IC 50 via a control line 66. The filter 64 can, for example, remove interfering frequency components from the battery voltage 10. Such interference voltages can, for example, be induced by loads. A voltage divider 67 can be disposed upstream of the filter 64. By means of the voltage divider, the voltage of the battery 10, which travels across the voltage measuring line 47 to the measuring module, can be reduced to a voltage level which can be processed by the filter 64 and the measuring module IC 50. In addition to the potential of the battery pole 18 that was provided in the aforementioned manner, the potential of the current conduction path 21 is available to the measuring module IC 50, which potential is applied to the connection of the measuring resistor 60 in the direction of the battery pole 19 as the potential of said battery pole 19. Alternatively, it is conceivable to dispose the measuring module 46 in the current conduction path 20 and to provide the potential of the battery pole 19 at the voltage measuring line 47. Because the potentials of both battery poles 18 and 19 are thus available, an accurate measurement of the high voltage is possible. In addition to measuring the high voltage of the battery 10 across all the battery cells 9, additional high voltages of the battery 10 or from the periphery thereof can be measured. To this end, additional voltage dividers 67 and additional switching devices 65 can be provided, wherein the latter can also be used to switch between the individual voltages to be measured. To this end, voltages that are not to be currently measured can be switched off and a voltage to be measured can be connected to the filter 64 and conducted to the measuring module IC 50.

The invention claimed is:

1. A battery management system (1) for a battery (10) having a plurality of battery cells (9) connected in series, comprising:
 a battery control unit (2),
 a plurality of low-voltage measuring devices (8), by which the voltage of each of the plurality of battery cells (9) is measured,
 at least one further measuring device, and
 a signal transmission device (7), which transmits signals indicative of measured data from low-voltage measuring devices (8) and from at least one further measuring device to the battery control unit (2); and
 wherein the at least one further measuring device is a high-voltage measuring device (4) which measures voltage across the plurality of the battery cells (9), the high-voltage measuring device (4) is a high voltage to low voltage converter (67).

2. The battery management system (1) according to claim 1, characterized in that low-voltage measuring devices (8) and the at least one further measuring device are interconnected in a chain circuit (daisy chain) in a single bus by the signal transmission device (7), wherein the battery management system is equipped to allow data, which are transmitted by the signal transmission device, to run through at least one component of the series circuit and subsequently to be passed on to an adjacent component.

3. The battery management system (1) according to claim 1, wherein the high-voltage measuring device (4) is a high voltage to low voltage converter (67).

4. The battery management system (1) according to claim 1, characterized in that the battery management system (1) includes at least one voltage measuring chip (50) comprising a communication module (17), wherein the communication module (17) is equipped to communicate via the signal transmission device (7) and the voltage measuring chip (50) has a separating device (11) for the galvanic separation and/or electrical isolation of the communication module (17) from the signal transmission device (7).

5. The battery management system (1) according to claim 1, wherein the battery management system (1) includes at least one voltage measuring chip (50) and the high-voltage measuring device (4) has the same voltage measuring chip as the low-voltage measuring device (8).

6. The battery management system (1) according to claim 1, wherein the battery management system (1) has a measuring module (46), which comprises a high-voltage measuring device (4) and a current measuring device (6), the measuring module (46) being equipped to transmit measuring signals via the signal transmission device (7) by an interface (17), wherein the high-voltage measuring device (4), at least parts of the current measuring device (6) and the interface (17) are integrated on a chip (50).

7. The battery management system (1) according to claim 6, wherein the measuring module (46) has a further current measuring device (6) for double measurement of the current flowing through the battery (10).

8. The battery management system (1) according to claim 6, characterized in that the measuring module (46) comprises a communication component, which is equipped to communicate with the battery control unit (2) by a signal, wherein a galvanic separation and/or electrical isolation, which is part of the measuring module (46), is effective between the communication component and the signal transmission device (7) and/or the battery control unit (2).

9. A battery (10) comprising a battery management system (1) according to claim 1.

10. The batter management system (1) according to claim 1, wherein the at least one further measuring device is a high-voltage measuring device (4) which measures voltage across a plurality of the battery cells (9).

11. The batter management system (1) according to claim 1, wherein the at least one further measuring device is a current measuring device (6) which measures current from or through the battery (10).

12. The batter management system (1) according to claim 1, wherein the at least one further measuring device is a measuring module including a high-voltage measuring device (4) and a current measuring device (6).

13. A method for measuring low voltages of each of a plurality of battery cells (9) of a battery by low-voltage measuring devices (8) and for measuring a high voltage of the battery (10) by at least one high-voltage measuring device (4) for a voltage across a plurality or all the battery cells (9), in which method signals indicative of data from the low-voltage measuring devices (8) and signals indicative of data from the high-voltage measuring device (4) are transmitted to the battery control unit (2) via the same signal transmission device (7).

\* \* \* \* \*